(12) United States Patent
Furuta et al.

(10) Patent No.: US 10,944,332 B2
(45) Date of Patent: Mar. 9, 2021

(54) POWER CONVERTER WITH SHIELD PLATE AND RESIN SUPPORT MEMBER

(71) Applicant: Hitachi Automotive Systems, Ltd., Hitachinaka (JP)

(72) Inventors: Yoichiro Furuta, Hitachinaka (JP); Kenichirou Nakajima, Hitachinaka (JP); Yuta Numakura, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 16/470,650

(22) PCT Filed: Dec. 6, 2017

(86) PCT No.: PCT/JP2017/043737
§ 371 (c)(1),
(2) Date: Jun. 18, 2019

(87) PCT Pub. No.: WO2018/131336
PCT Pub. Date: Jul. 19, 2018

(65) Prior Publication Data
US 2019/0326827 A1 Oct. 24, 2019

(30) Foreign Application Priority Data
Jan. 13, 2017 (JP) .............................. JP2017-004039

(51) Int. Cl.
*H02M 7/00* (2006.01)
*H02M 1/08* (2006.01)
(Continued)

(52) U.S. Cl.
CPC ............. *H02M 7/003* (2013.01); *H02M 1/08* (2013.01); *H02M 7/48* (2013.01); *H02M 7/797* (2013.01); *H05K 5/03* (2013.01); *H05K 7/1432* (2013.01)

(58) Field of Classification Search
CPC ...... H02M 3/33523; H02M 3/28; H02M 1/08; H02M 2001/0025; H02N 2/181;
(Continued)

(56) References Cited

U.S. PATENT DOCUMENTS

| 5,756,893 A * | 5/1998 | Kondo | ..................... G01F 1/684 |
| | | | 73/204.22 |
| 6,762,937 B2 * | 7/2004 | Kimoto | ................. H02M 7/003 |
| | | | 165/185 |

(Continued)

FOREIGN PATENT DOCUMENTS

| JP | 5184218 B2 | 1/2013 |
| JP | 2013-055763 A | 3/2013 |

(Continued)

OTHER PUBLICATIONS

Received STIC search report from EIC 2800 searcher Samir Patel dated Nov. 14, 2019. (Year: 2019).*

(Continued)

*Primary Examiner* — Shawki S Ismail
*Assistant Examiner* — Htet Z Kyaw
(74) *Attorney, Agent, or Firm* — Foley & Lardner LLP

(57) ABSTRACT

Provided is a power converter capable of being miniaturized while securing noise resistance and insulation between a power semiconductor module and a drive circuit board. The power converter according to the present invention includes a power semiconductor module that converts DC power into AC power, a driving signal circuit board that outputs a driving signal for driving the power semiconductor module, and a resin support member that supports the driving signal circuit board, in which the power semiconductor module has a signal terminal that transmits the driving signal and a main terminal that transmits an input of the DC power and an output of the AC power, the support (Continued)

member is disposed between the driving signal circuit board and the power semiconductor module, the signal terminal and the main terminal are provided on a side of the power semiconductor module that faces the support member, and a metal shielding plate is embedded in a region between the driving signal circuit board in the support member and the main terminal.

6 Claims, 8 Drawing Sheets

(51) Int. Cl.
    *H02M 7/48* (2007.01)
    *H02M 7/797* (2006.01)
    *H05K 5/03* (2006.01)
    *H05K 7/14* (2006.01)

(58) Field of Classification Search
    CPC ........ F16F 9/532; F16F 1/3615; F16F 1/3605; F16F 2228/066; F16F 2224/043; F16F 2224/025
    USPC ...................................................... 363/21.12
    See application file for complete search history.

(56) References Cited

U.S. PATENT DOCUMENTS

| | | | | |
|---|---|---|---|---|
| 8,698,287 | B2* | 4/2014 | Soyano | H01L 23/057 257/660 |
| 2002/0129962 | A1* | 9/2002 | Doshita | B60R 16/0215 174/72 A |
| 2011/0261588 | A1* | 10/2011 | Hattori | H02K 11/33 363/13 |
| 2013/0058143 | A1* | 3/2013 | Tachibana | H02M 7/003 363/131 |
| 2013/0265808 | A1* | 10/2013 | Ishii | H02M 1/12 363/97 |
| 2014/0126154 | A1* | 5/2014 | Higuchi | H05K 7/20927 361/714 |
| 2014/0140119 | A1* | 5/2014 | Shinohara | H05K 7/1432 363/141 |
| 2015/0256096 | A1* | 9/2015 | Nishizawa | B60L 50/16 363/131 |
| 2015/0305188 | A1* | 10/2015 | Maeda | H02M 7/003 361/728 |
| 2015/0340934 | A1* | 11/2015 | Suzuki | H02K 11/0094 310/71 |
| 2016/0007492 | A1* | 1/2016 | Suwa | H05K 7/1432 361/820 |
| 2016/0181940 | A1* | 6/2016 | Takahashi | H05K 5/0247 361/752 |
| 2017/0222570 | A1 | 8/2017 | Okubo et al. | |

FOREIGN PATENT DOCUMENTS

| | | |
|---|---|---|
| JP | 5417314 B2 | 11/2013 |
| WO | WO-2013/015106 A1 | 1/2013 |
| WO | WO-2016/080068 A1 | 5/2016 |

OTHER PUBLICATIONS

International Search Report and Written Opinion dated Mar. 6, 2018, in PCT/JP2017/043737.

* cited by examiner

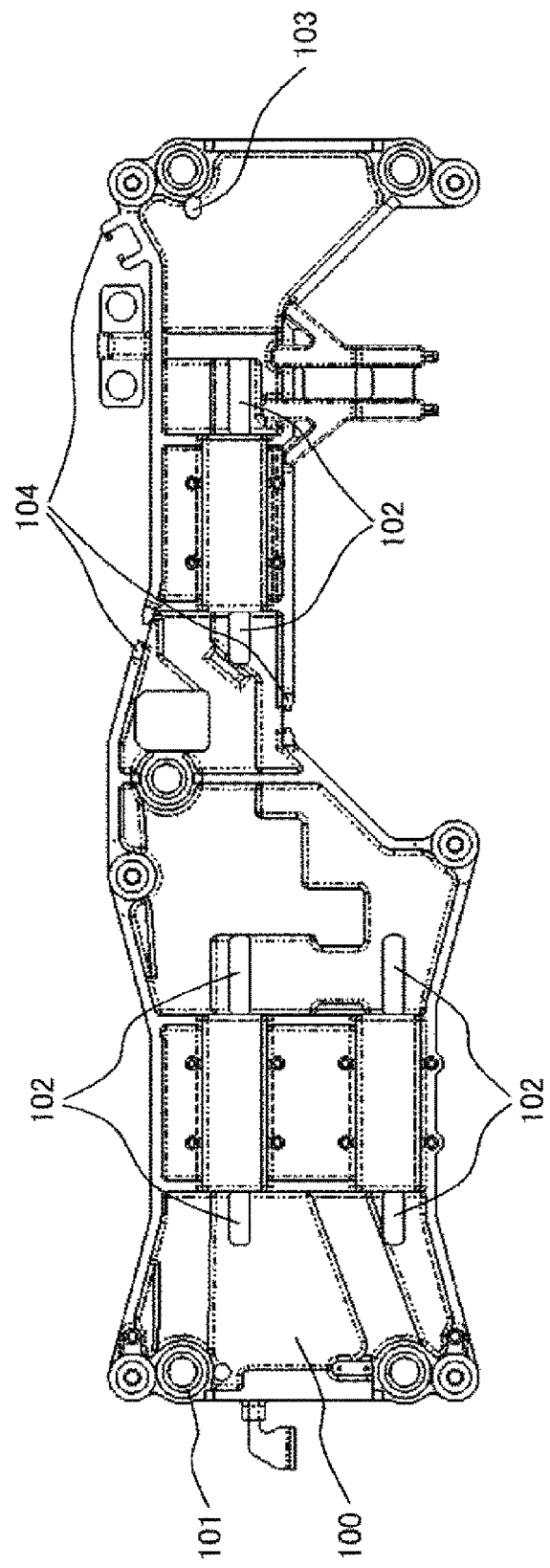

POWER CONVERTER WITH SHIELD PLATE AND RESIN SUPPORT MEMBER

TECHNICAL FIELD

The present invention relates to a structure of a power converter, and more particularly to a technique effective when applied to a power converter incorporating a power semiconductor module and a drive circuit board.

BACKGROUND ART

Due to electrification of automobiles and increase in mounting density of electric components, noise countermeasures for improving the reliability of in-vehicle components are important. Especially, inverters mounted in an electric vehicle (EV), a hybrid electric vehicle (HEV), a plug-in hybrid electric vehicle (PHEV) or the like are achieving a high output while being miniaturized, and securing of insulation is an important issue as well as noise countermeasures.

As a background art in this technical field, there is a technique such as PTL 1, for example. PTL 1 discloses "a power converter including: a power module having a power semiconductor element that converts a DC current into an AC current; a control circuit board that outputs a control signal for controlling the power semiconductor element; a driver circuit board that outputs a driving signal for driving the power semiconductor element on the basis of the control signal; and a conductive base plate disposed in a space between the driver circuit board and the control circuit board and having an elongated wiring opening formed therein".

In PTL 1, noise between the driver circuit board and the control circuit board is shielded by a conductive base plate (metal shielding plate).

PTL 2 discloses "a capacitor mounted type inverter unit including an inverter including a switching element of a plurality of phases, a control board of the inverter, and a smoothing capacitor, in which the capacitor mounted type inverter unit is equipped with a first case that supports the inverter and a second case that accommodates the smoothing capacitor and the control board together with the first case, a support frame for supporting the control board is accommodated in the second case, the support frame is fastened to the second case, a resin material is filled in the second case in which the support frame and the smoothing capacitor are buried such that a columnar support unit projecting from the support frame is exposed, and the first case and the second case are abutted with each other such that the control board and the inverter fixed to the columnar support unit face each other".

In PTL 2, the support frame is formed of a metallic material and disposed so as to cover the surface of the smoothing capacitor on the side facing the inverter, so that the electric noise radiated from the capacitor is shielded and the control board fixed to the columnar support unit of the support frame can be prevented from being exposed to noise.

CITATION LIST

Patent Literature

PTL 1: JP 5417314 B2
PTL 2: JP 5184218 B2

SUMMARY OF INVENTION

Technical Problem

As described above, in an in-vehicle inverter, the component mounting density increases due to the miniaturization and high output of the inverter, the distance between a power semiconductor module incorporated in the inverter and a drive circuit board that outputs a driving signal is short, and therefore, securing of noise shielding property and insulation is a problem.

In a conventional inverter, a resin support structure, a bus bar in which an electric current flows, and a bus bar in which a current for detecting the state of a fuse flows are mounted as separate components, so that reducing the number of components is also a problem for miniaturization.

In the case of providing a metal shielding plate in the inverter for noise shielding, a method of installing the metal shielding plate in a limited space is also a problem.

In PTL 1, although the noise between the driver circuit board and the control circuit board is shielded, the noise shielding and insulation between the power semiconductor module and the driver circuit board is insufficient, the number of components is large, and this is disadvantageous for miniaturization. In PTL 2, since the support frame and the capacitor of the control board incorporated in the inverter are fixed by filling of resin, it is necessary to fill a sufficient amount of resin for securing attachment reliability of the capacitor, and this is also disadvantageous for miniaturization of the inverter.

It is an object of the present invention to provide a power converter incorporating a power semiconductor module and a drive circuit board, capable of securing noise resistance and insulation between the power semiconductor module and the drive circuit board while being miniaturized.

Solution to Problem

In order to solve the above problem, the present invention includes a power semiconductor module that converts DC power into AC power, a driving signal circuit board that outputs a driving signal for driving the power semiconductor module, and a resin support member that supports the driving signal circuit board, in which the power semiconductor module has a signal terminal that transmits the driving signal and a main terminal that transmits an input of the DC power and an output of the AC power, the support member is disposed between the driving signal circuit board and the power semiconductor module, the signal terminal and the main terminal are provided on a side of the power semiconductor module that faces the support member, and a metal shielding plate is embedded in a region between the driving signal circuit board in the support member and the main terminal.

Advantageous Effects of Invention

According to the present invention, a power converter incorporating a power semiconductor module and a drive circuit board, capable of securing noise resistance and insulation between a power semiconductor module and a drive circuit board while being miniaturized can be realized.

The problems, configurations, and effects other than those described above will be clarified from the description of the following embodiments.

BRIEF DESCRIPTION OF DRAWINGS

FIG. 1A is a plan view showing a resin support structure according to an embodiment of the present invention.

DESCRIPTION OF EMBODIMENTS

Figure 1B:
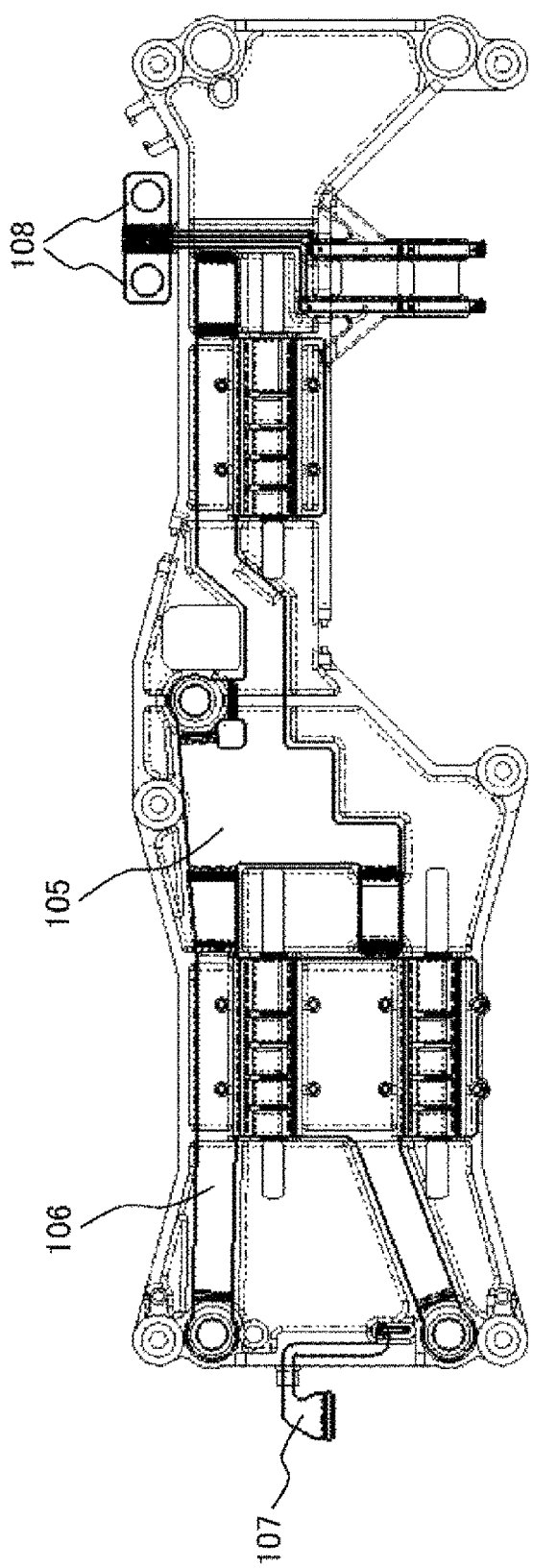
FIG. 1B is a plan view showing a resin support structure according to an embodiment of the present invention.

Embodiments of the present invention will be described below with reference to the drawings. In each drawing, the same components are denoted by the same reference numerals, and a detailed description thereof will be omitted for overlapping portions.

First Embodiment

Figure 2:
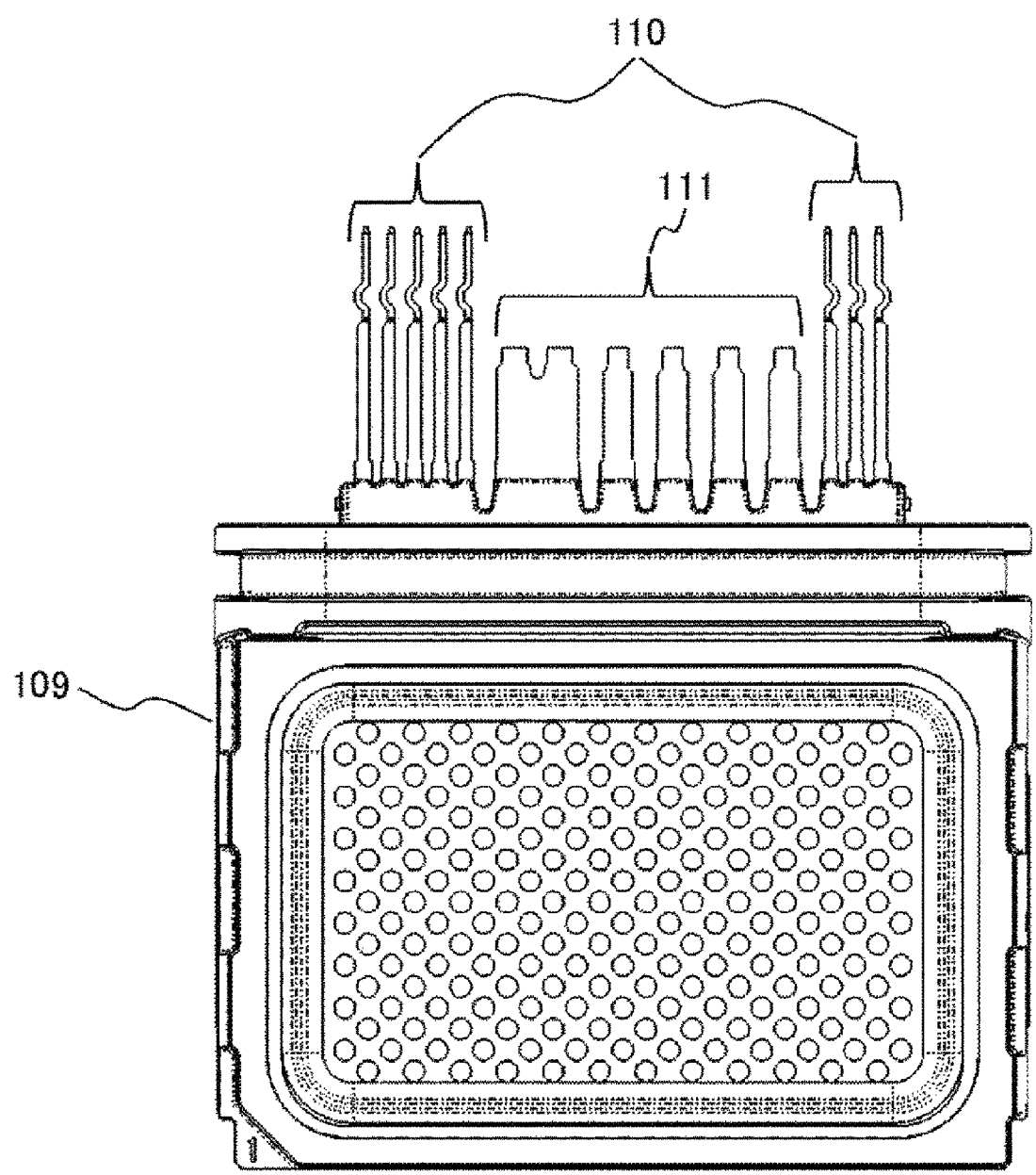
FIG. 2 is a diagram showing a power semiconductor module according to an embodiment of the present invention.

A power converter according to a first embodiment will be described with reference to FIGS. 1A to 4C. First, referring to FIGS. 1A to 2, a support member of a driving signal circuit board incorporated in the power converter of the present embodiment will be described. FIG. 1A is a plan view (top view) showing a schematic configuration of a resin support member (resin support structure) 100 of the present embodiment, and FIG. 1B is a plan view (transmission view) showing the internal structure of FIG. 1A. FIG. 2 is a diagram showing a power semiconductor module mounted on the power converter.

The resin support member 100 is a resin component for supporting a driving signal circuit board incorporated in the power converter together with a power semiconductor module 109 in the power converter. As shown in FIG. 1A, the resin support member 100 is provided with a plurality of insertion holes 102 through which a signal terminal 110 of the power semiconductor module 109 is inserted. Here, an example is shown in which three pairs of insertion holes 102 are provided, considering two insertion holes 102 as a pair. The resin support member 100 is also provided with an insertion hole (through hole) 103 through which a positioning pin of a case serving as a housing of the power converter is inserted.

One end of the resin support member 100 is provided with a fixing portion 101 serving as a screw fastening point for fixing the resin support member 100 to a housing (case) of the power converter. A plurality of locking portions 104, which are protrusions for locking a harness (wiring) to be described later, are provided.

As shown in FIG. 1B, a metal shielding plate 105, a fuse blowing detection bus bar 107, and a high voltage bus bar 108 are embedded in the resin support member 100. The metal shielding plate 105 has an extended portion 106 extending to the fixing portion 101. The metal shielding plate 105 is a metal component for shielding noise between the power semiconductor module 109 and the driving signal circuit board. The extended portion 106 is a part of a metal shielding plate which is provided so as to extend to connect the metal shielding plate 105 to a fixing point (the fixing portion 101) between the resin support member 100 and a case.

The fuse blowing detection bus bar 107 is a DC circuit body for connecting a fuse (not shown) and a driving signal circuit board, and the high voltage bus bar 108 is a DC circuit body for supplying a high voltage current to the driving signal circuit board.

As shown in FIGS. 1A and 1B, the resin support member 100 of the present embodiment is made of the metal shielding plate 105, the extended portion 106 which is an extended portion thereof, the fuse blowing detection bus bar 107, and the high voltage bus bar 108 molded with resin so that these metal members (conductive members) are formed to be embedded in the resin.

The power semiconductor module 109 is an inverter component for converting a DC current (DC power) supplied into the power converter into an AC current (AC power). As shown in FIG. 2, the power semiconductor module 109 is provided with a signal terminal 110 and a main terminal 111 in one side. The signal terminal 110 is a terminal for connecting the power semiconductor module 109 and the driving signal circuit board, and transmits a driving signal from the driving signal circuit board to the power semiconductor module 109.

The main terminal 111 is a terminal for connecting the power semiconductor module 109 and the high voltage DC circuit body, and transmits an input of a high voltage power supply (DC current (DC power)) from an external power supply (not shown) to the power semiconductor module 109, and an output of an AC current (AC power) from the power semiconductor module 109 to an external load (not shown). In FIG. 2, an example is shown in which four thin terminals on the right side of the main terminal 111 are DC current input terminals and one thick left terminal is an AC current output terminal.

Figure 3A:
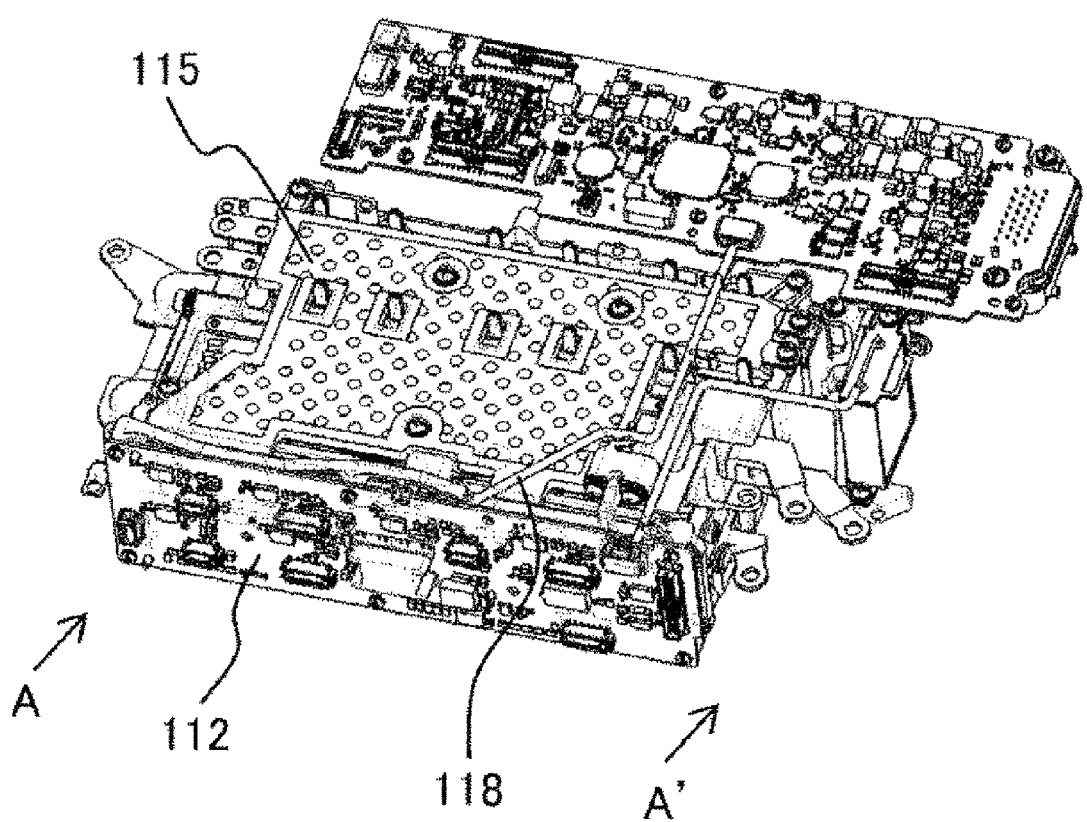
FIG. 3A is a diagram showing an overall outline of a power converter according to an embodiment of the present invention.
Figure 3B:
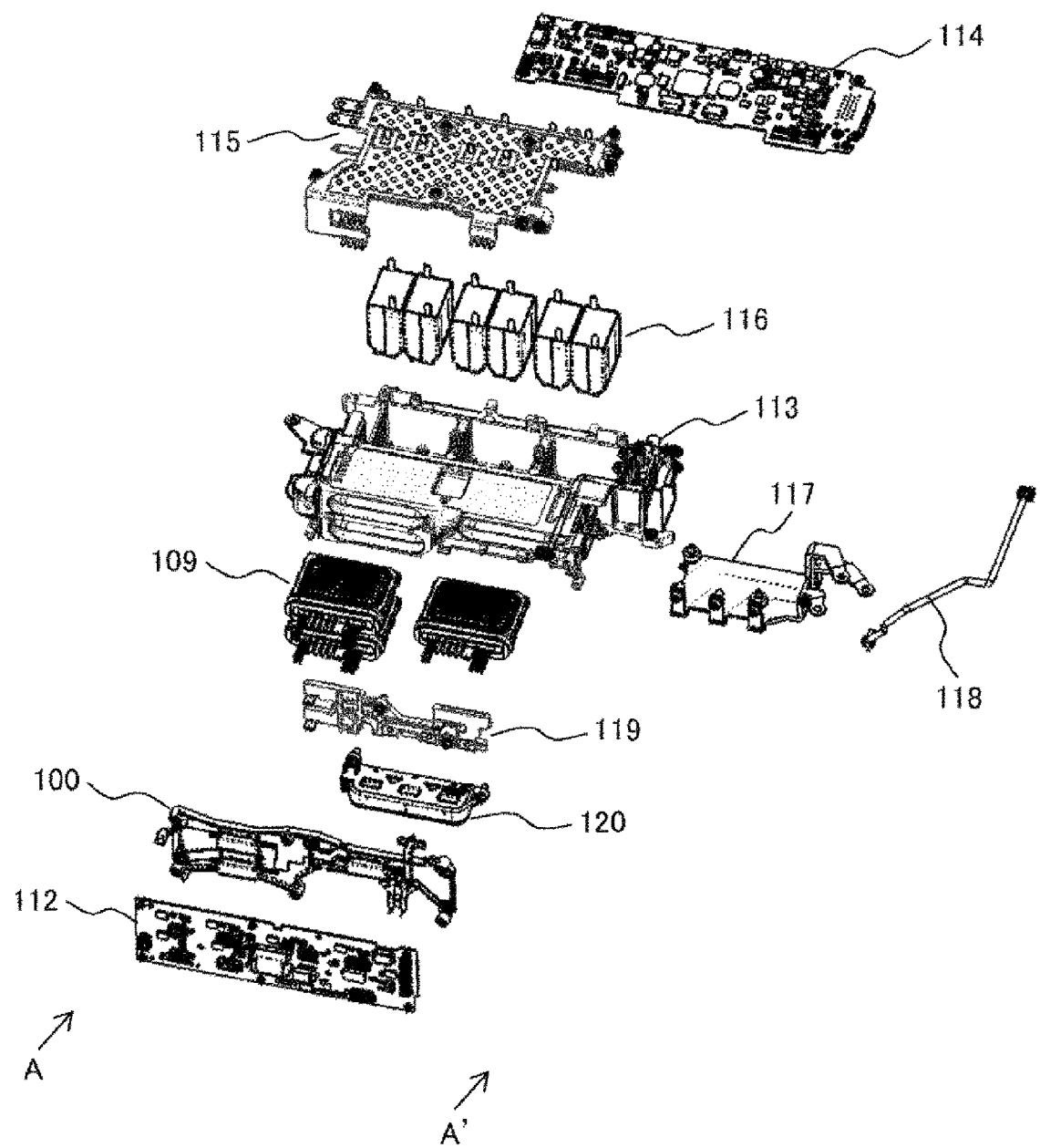
FIG. 3B is an exploded view showing a component configuration of the power converter of FIG. 3A.

Next, referring to FIGS. 3A and 3B, the overall outline and the component configuration of the power converter of the present embodiment will be described. FIG. 3A is a perspective view showing the overall outline of the power converter of the present embodiment. FIG. 3B is an exploded view showing a component configuration of the power converter in FIG. 3A, and shows a state viewed from the A-A' direction in FIG. 3A.

As shown in FIG. 3A, a driving signal circuit board 112 is incorporated in the front surface of the power converter, and the DC current bus bar 115 is incorporated in the upper surface. As described above, the driving signal circuit board 112 is a board for supplying a signal for driving the power semiconductor module 109. The DC current bus bar 115 is a DC circuit body for supplying a DC current to the power semiconductor module 109.

Figure 5:
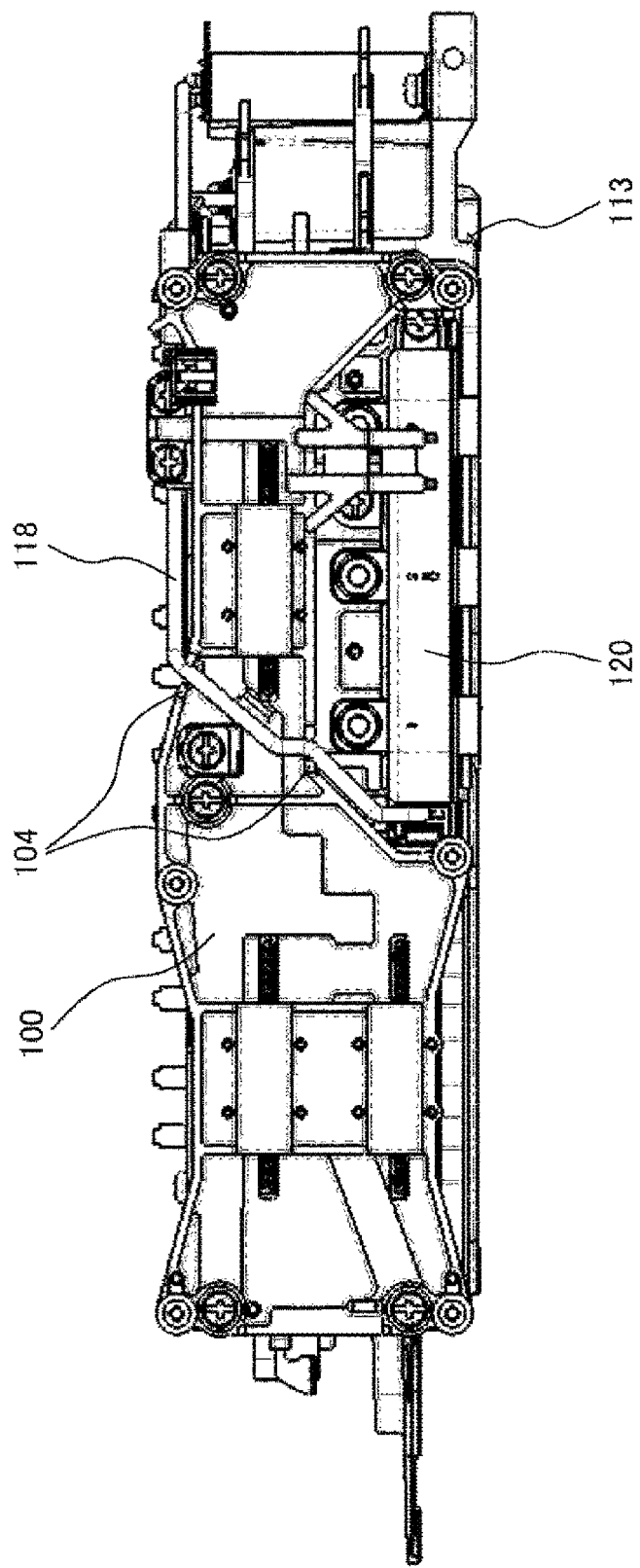
FIG. 5 is a plan view showing a resin support structure according to an embodiment of the present invention.

A harness 118 is incorporated in the upper surface of the power converter. The harness 118 is a wiring for connecting the current sensor and the control signal circuit board, as will be described later in a second embodiment (FIG. 5).

Referring to the exploded view of FIG. 3B, the component configuration of the power converter (inverter) of the present embodiment and the method of assembling each component will be described.

The power semiconductor module 109 and the capacitor 116 are inserted into a metal case 113 which is a housing of the power converter. The case 113 forms a storage space of the power semiconductor module 109. The capacitor 116 is an element for removing noise of a DC current.

Next, the DC current bus bar 115, an AC current bus bar 119, a current sensor 120, and an AC current bus bar 117 are attached to the case 113. The AC current bus bars 117 and 119 are AC circuit bodies for transmitting the AC current from the power semiconductor module 109.

Next, the resin support member 100 is attached to the case 113, and the signal terminal 110 of the power semiconductor module 109 is inserted into the insertion hole 102 of the resin support member 100.

Subsequently, the harness 118 is connected to the current sensor 120 and the control signal circuit board 114, and is fixed to the locking portion 104 of the resin support member 100. The control signal circuit board 114 is a board for sharing a signal for controlling the power semiconductor module 109.

Finally, the driving signal circuit board 112 is attached to the resin support member 100, and the power converter shown in FIG. 3A is completed.

Figure 4A:
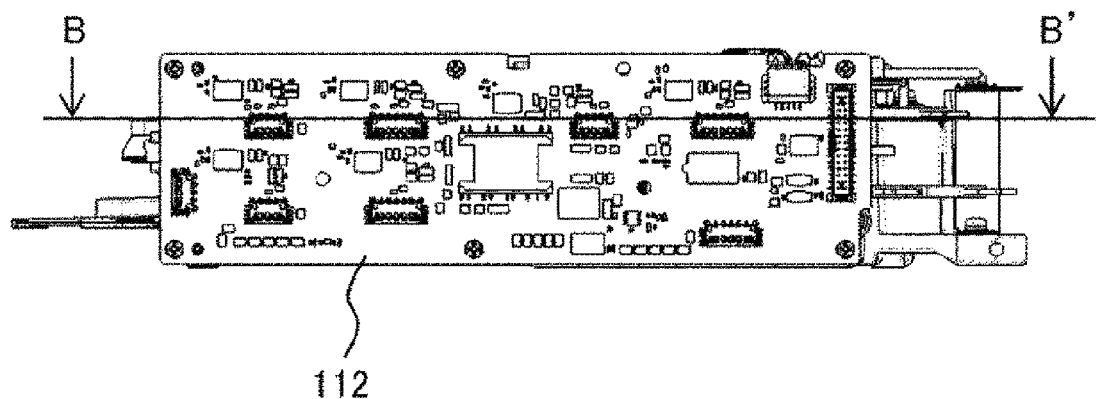
FIG. 4A is a plan view showing a driving signal circuit board of the power converter according to an embodiment of the present invention.
Figure 4B:
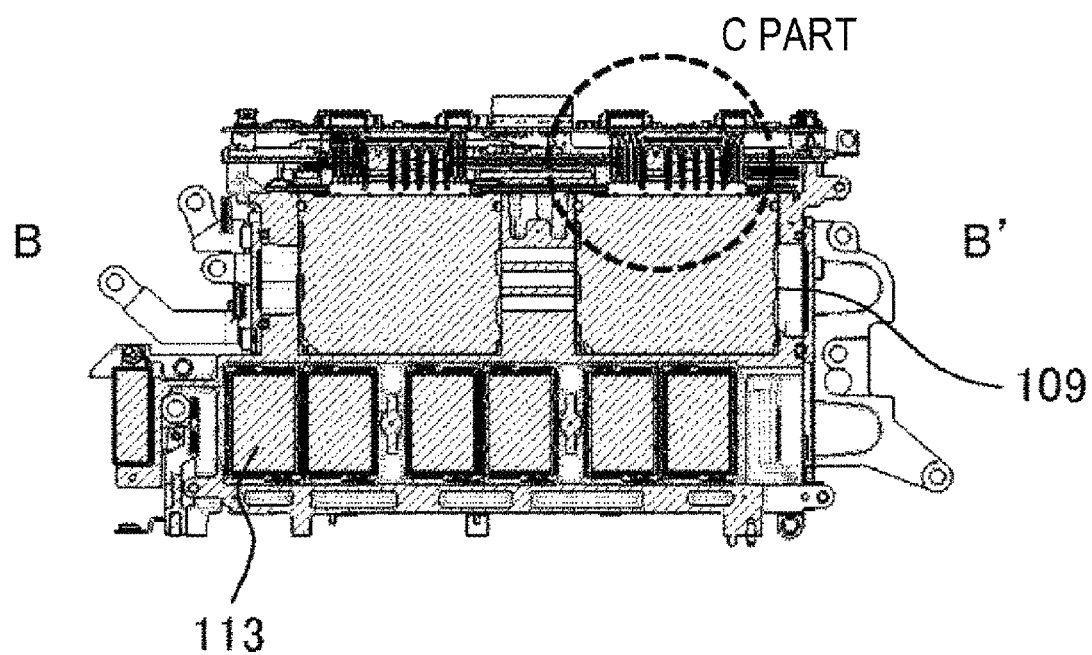
FIG. 4B is a cross-sectional view taken along line B-B' in FIG. 4A.
Figure 4C:
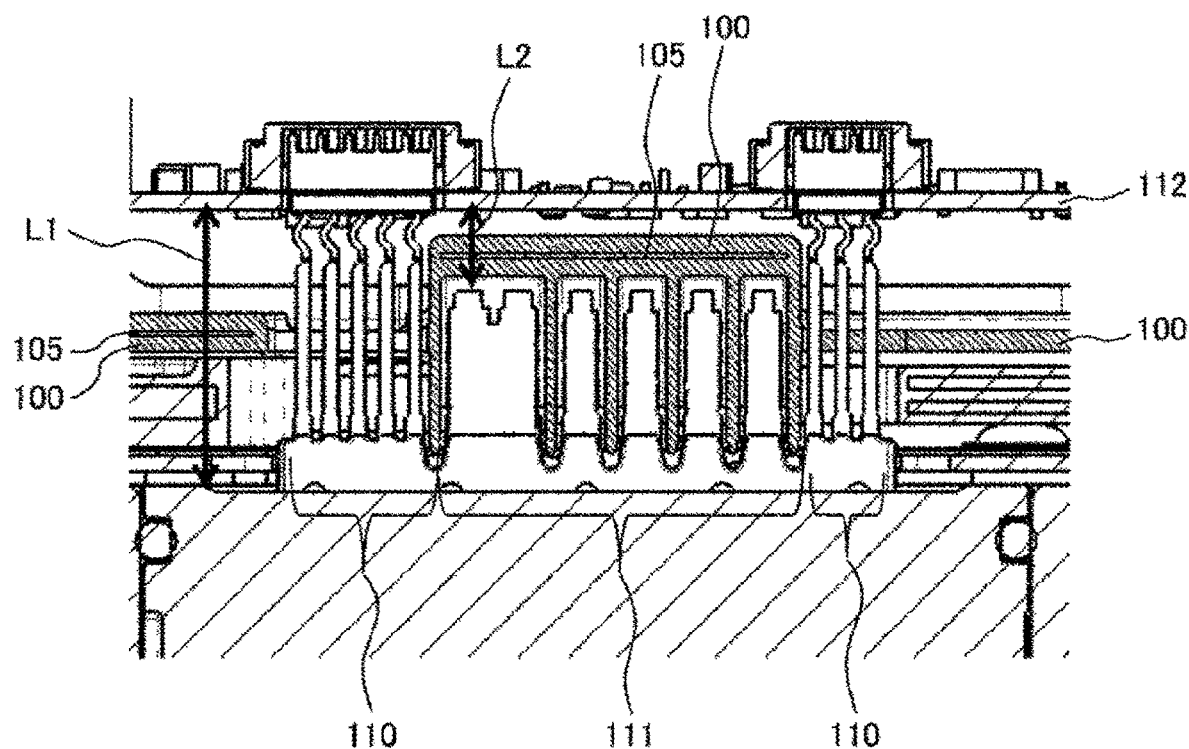
FIG. 4C is an enlarged view of a C part of FIG. 4B.

The arrangement (positional relationship) of the power semiconductor module 109, the driving signal circuit board 112, and the resin support member 100 will be described with reference to FIGS. 4A to 4C. FIG. 4A is a view of the driving signal circuit board 112 viewed from the direction A-A' of FIG. 3A. FIG. 4B is a cross-sectional view taken along line B-B' in FIG. 4A. FIG. 4C is an enlarged view of a C part of FIG. 4B.

As shown in FIG. 4C, the resin support member 100 is installed so as to surround the main terminal 111 of the power semiconductor module 109. At the same time, the metal shielding plate 105 embedded in the resin support member 100 is installed between the main terminal 111 and the driving signal circuit board 112. Although the metal shielding plate 105 needs to be installed at least between the main terminal 111 and the driving signal circuit board 112, the metal shielding plate 105 may be provided in other regions as indicated by reference numeral 105 at the left end portion in FIG. 4C.

As described above, in recent years, the distance L1 between the power semiconductor module 109 and the drive circuit board 112 has been decreasing due to the demand for miniaturization of the inverter, and the distance L2 between the power semiconductor module 109 and the main terminal 111 also becomes smaller at the same time. Along with this, securing insulation between members and noise resistance is a problem.

As shown in FIG. 4C, in the power converter of the present embodiment, a support member made of resin for supporting the driving signal circuit board 112 (resin support member 100) is disposed between the main terminal 111 to which the high voltage is applied and the driving signal circuit board 112 so that insulation can be secured.

The metal shielding plate 105 serving as an electromagnetic shield is embedded in the region between the driving signal circuit board 112 and the main terminal 111 of the resin support member 100 so that noise resistance can be secured.

Accordingly, while securing the insulation and noise resistance between the main terminal 111 of the power semiconductor module 109 and the driving signal circuit board 112, the distance L1 between the driving signal circuit board 112 and the power semiconductor module 109 and the distance L2 between the driving signal circuit board 112 and a tip end of the main terminal 111 can be reduced, so that it is possible to miniaturize the power converter.

As described above, according to the power converter of the present embodiment, a resin support member in which a metal shielding plate is embedded is disposed between the driving signal circuit board and the power semiconductor module, particularly between the driving signal circuit board and the main terminal of the power semiconductor module to which the high voltage is applied, so that it is possible to miniaturize the power converter while securing insulation and noise resistance between the driving signal circuit board and the power semiconductor module.

Since the fuse blowing detection bus bar 107 for detecting fuse blowing and the high voltage bus bar 108 for transmitting the current are embedded in the resin support member 100, it is unnecessary to individually manufacture the resin support member, the high voltage bus bar, and the fuse blowing detection bus bar which are conventionally manufactured as separate components, thereby reducing the number of components. This increases the ease of assembly of the power converter, which leads to space saving.

Since the metal shielding plate 105 has the extended portion 106 extending to the fixing portion 101, and the resin support member 100 is connected to the case 113 with the fixing portion 101, the case 113 and the metal shielding plate 105 can be connected. As a result, the metal shielding plate 105 is grounded to the case 113, and an effect of shielding noise can be obtained.

Since the extended portion 106 is provided on the metal shielding plate 105 and is grounded to the case 113 which is the casing via the extended portion 106, it is unnecessary to manufacture a separate component for grounding the metal shielding plate 105. At the same time, since the metal shielding plate 105 and the extended portion 106 serve as reinforcing members of the resin support member 100, the strength of the resin support member 100 is improved.

Second Embodiment

Referring to FIG. 5, a power converter according to a second embodiment will be described. FIG. 5 shows a state in which the harness 118 and the current sensor 120 are attached to the resin support member 100 of FIG. 1A.

The resin support member 100 is provided with a plurality of hook-like locking portions 104, and the harness 118 can be locked by the locking portions 104. One of the connectors of the harness 118 is connected (inserted) to the current sensor 120, and another connector is connected (inserted) to the control signal circuit board 114 (not shown). As a result, the current sensor 120 and the control signal circuit board 114 are connected.

According to the power converter of the present embodiment, by locking the harness 118 to the locking portion 104 of the resin support member 100, loosening of the harness 118 is prevented and the assembly work is facilitated. Since it is unnecessary to separately provide the wiring for connecting the current sensor 120 and the control signal circuit board 114, it is possible to save wiring space and contribute to miniaturization of the power converter.

The present invention is not limited to the embodiments described above, and various modifications are included. For example, each of the embodiments described above has been described in detail in order to explain the present invention in an easy-to-understand manner, and the present invention is not necessarily limited to those having all the configurations described in the embodiments. A part of the configuration of one embodiment can be replaced by the configuration of another embodiment, and the configuration of another embodiment can be added to the configuration of one embodiment. With respect to part of the configuration of each embodiment, other configurations can be added, deleted, or replaced.

REFERENCE SIGNS LIST 100 resin support member (resin support structure)
101 fixing portion
102 insertion hole
103 insertion hole
104 locking portion
105 metal shielding plate
106 extended portion
107 fuse blowing detection bus bar
108 high voltage bus bar
109 power semiconductor module
110 signal terminal
111 main terminal
112 driving signal circuit board
113 case
114 control signal circuit board
115 DC current bus bar
116 capacitor
117 AC current bus bar
118 harness
119 AC current bus bar
120 current sensor
L1 distance between driving signal circuit board 112 and power semiconductor module 109
L2 distance between driving signal circuit board 112 and tip end of main terminal 111

The invention claimed is:

1. A power converter comprising:
a power semiconductor module that converts DC power into AC power;
a driving signal circuit board that outputs a driving signal for driving the power semiconductor module; and
a resin support member that supports the driving signal circuit board,
wherein the power semiconductor module comprises a signal terminal that transmits the driving signal and a main terminal that transmits an input of the DC power and an output of the AC power,
the resin support member is disposed between the driving signal circuit board and the power semiconductor module,
the signal terminal and the main terminal are provided on a side of the power semiconductor module that faces the resin support member,
a metal shielding plate is embedded in a region between the driving signal circuit board in the resin support member and the main terminal, and
a bus bar that transmits a DC current is embedded in the support member.

2. The power converter according to claim 1, further comprising a metal case forming an accommodating space of the power semiconductor module, wherein
the support member comprises a fixing portion that fixes the resin support member to the case and an extended portion in which the shielding plate extends to the fixing portion, and
the shielding plate is grounded to the case via the extended portion.

3. The power converter according to claim 1,
wherein the resin support member comprises a locking portion for locking a harness.

4. The power converter according to claim 3,
wherein the harness connects a control signal circuit board sharing a control signal for controlling the power semiconductor module and a current sensor for measuring a current flowing through an AC current bus bar that transmits an AC current from the power semiconductor module.

5. The power converter according to claim 1,
wherein the bus bar is a fuse blowing detection bus bar arranged to detect fuse blowing.

6. The power converter according to claim 1,
wherein the bus bar is a voltage bus bar arranged to transmit current.

* * * * *